United States Patent
Mulcahy et al.

(10) Patent No.: US 7,279,842 B2
(45) Date of Patent: Oct. 9, 2007

(54) MAGNETRON WITH WAVY STRAPS

(75) Inventors: Bernard Richard Mulcahy, Chelmsford (GB); Martin Bernard Edwards, Chelmsford (GB)

(73) Assignee: E2V Technologies (UK) Ltd., Chelmsford, Essex (GB)

( * ) Notice: Subject to any disclaimer, the term of this patent is extended or adjusted under 35 U.S.C. 154(b) by 0 days.

(21) Appl. No.: 10/516,349

(22) PCT Filed: May 29, 2003

(86) PCT No.: PCT/GB03/02342

§ 371 (c)(1),
(2), (4) Date: Nov. 30, 2004

(87) PCT Pub. No.: WO03/103130

PCT Pub. Date: Dec. 11, 2003

(65) Prior Publication Data

US 2005/0225247 A1    Oct. 13, 2005

(30) Foreign Application Priority Data

May 31, 2002  (GB) .................................. 0212630.8

(51) Int. Cl.
*H01J 23/22* (2006.01)
*H01J 25/587* (2006.01)

(52) U.S. Cl. .................................. 315/39.69; 315/39.75

(58) Field of Classification Search ............. 315/39.51, 315/39.67, 39.69, 39.75
See application file for complete search history.

(56) References Cited

U.S. PATENT DOCUMENTS

| 2,766,403 | A | * | 10/1956 | Skowron | ................. | 315/39.53 |
| 2,777,090 | A | | 1/1957 | Volz | ........................ | 315/39.69 |
| 4,205,257 | A | * | 5/1980 | Oguro et al. | ............ | 315/39.69 |
| 4,743,805 | A | * | 5/1988 | Takada | .................... | 315/39.75 |
| 5,146,136 | A | * | 9/1992 | Ogura et al. | ............. | 315/39.69 |

FOREIGN PATENT DOCUMENTS

| GB | 612415 | A | 11/1948 |
| GB | 666559 | A | 2/1952 |
| GB | 734871 | A | 8/1955 |
| GB | 2173636 | A | 10/1986 |
| GB | 2 226 696 | A | 7/1990 |
| GB | 2 377 816 | A | 1/2003 |
| JP | 59-94333 | A | 5/1984 |
| JP | 5-266816 | | 10/1993 |
| JP | 6-203761 | A | 7/1994 |

OTHER PUBLICATIONS

Ito Yuichi, Magnetron, publication No. 05266816, publication dated Oct. 15, 1993, ABSTRACT.

* cited by examiner

*Primary Examiner*—Thuy Vinh Tran
(74) *Attorney, Agent, or Firm*—Venable LLP; Robert Kinberg; Jeffri A. Kaminski (57) ABSTRACT

A magnetron of the type having a strap ring has protruding regions of the strap ring arranged so as to increase the capacitance between the strap ring and another strap ring or between the strap ring and anode vanes. Increasing the capacitance at selected portions of the strap ring allows control of the frequency response of the magnetron.

20 Claims, 8 Drawing Sheets

MAGNETRON WITH WAVY STRAPS

This Application is a national phase application under 35 U.S.C. 371 claiming the benefit of PCT/GB03/02342 filed on May 29, 2003, which has priority based on United Kingdom Application No. 0212630.8 filed on May 31, 2002.

FIELD OF THE INVENTION

The present invention relates to magnetrons.

BACKGROUND OF THE INVENTION

Magnetrons are well-known vacuum electron discharge devices used to generate electromagnetic filed in the microwave frequency range. A typical magnetron comprises a cylindrical cathode, a cylindrical anode surrounding the cathode and a plurality of resonant cavities formed in the anode by either slots or vanes. An electric field is established between the cathode and the anode, and a magnetic field is applied perpendicular to the electric field in the so-called interaction region, which is the evacuated space between the cathode and the resonant cavities in the anode. When the value of E/H is suitable, electrons emitted from the cathode interact with the electric and magnetic fields to generate microwave energy at a frequency determined by the parameters and the resonance characteristics of the cavities.

A known problem with magnetrons is that of unwanted emissions. These generally take two forms: the first is amplification of a harmonic of the desired mode. The other form of unwanted emission is called moding; that is, significant cavity responses occurring at frequencies other than the frequency for which the magnetron is designed to operate.

Conventionally, harmonic emissions are reduced by means of external microwave filters or by employing complex output systems embodying integral filters.

The concept of strapping was devised as a solution to the problem of moding. Strapping, as conventionally understood, is the joining of alternate anode vanes by means of a closed ring. Each pair of vanes forms a resonant cavity there between, and all such cavities are maintained at the same electrical potential. Thus, alternate anode vanes are locked into operation in the desired mode, known as the π mode. The π mode has node points of the same distance apart as the distance between alternate vanes.

A problem has been encountered with conventional straps in that the currents that circulate in the straps, to equalise the voltage on alternate vanes, may also generate an electromagnetic field. This field may interfere with the operation and performance of the magnetron owing to its proximity to the cathode.

A proposed solution to this problem is that of providing a break in the strap. This prohibits the flow of current between the vanes that the strap connects. However, a drawback of this approach is that it increases the frequency separation of the modes of operation and may also cause oscillations at undesired frequencies.

SUMMARY OF THE INVENTION

The invention is defined in the claims to which reference is directed.

An embodiment of the invention provides a magnetron comprising a plurality of anode vanes and a first strap in contact with alternate ones of the vanes, the strap having a protruding region. The provision of protruding regions around the ring provides variations in capacitance between the strap and another strap or between the strap and the others of the anode vanes. The change in capacitance increases the stability of the magnetron in the wanted mode, limits oscillations at undesired frequencies and reduces the coupling of harmonics into the cathode structure.

Preferably, a plurality of protruding regions is provided, the protrusions being spaced regularly around a portion of the strap.

Advantageously, the strap is adjustable, to allow the capacitance to be adjusted as required. This feature allows the user to retune the pi–1 mode to a different frequency range.

The principle operation is that distortions or protuberances of one strap ring cause localised variations in capacitance. The capacitance between strap rings at the localised portions or between a strap ring and anode vanes is increased. The effect can thus be accomplished either between rings, or between a strap and an anode vane, which is attached to a different strap.

Typically, the protrusions are arranged periodically, but other arrangements are possible as will be described. The arrangements can affect the distributions of RF voltages for the desired and undesired modes of oscillation differently and/or can reduce harmonic levels and/or RF coupling into the cathode structure.

A plurality of straps may be provided, some or all of which may include at least one protrusion.

BRIEF DESCRIPTION OF THE FIGURES

An embodiment of the invention will now be described, by way of example, with reference to the accompanying drawings, in which.

DESCRIPTION OF EMBODIMENTS OF THE INVENTION

Like reference numerals have been given to like parts throughout the specification.

Figure 1:
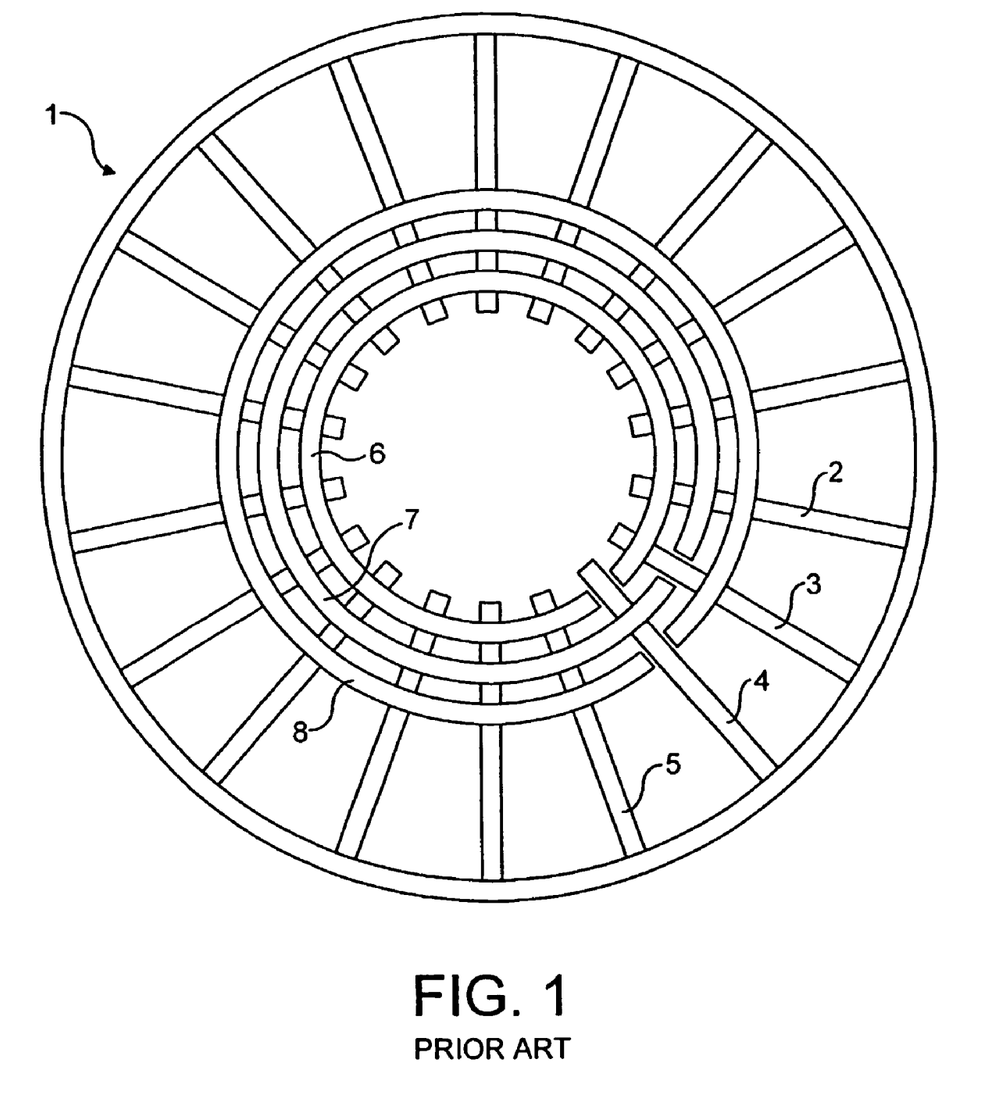
FIG. 1 is a plan view of the anode and strap arrangement of a conventional magnetron.
Figure 2:
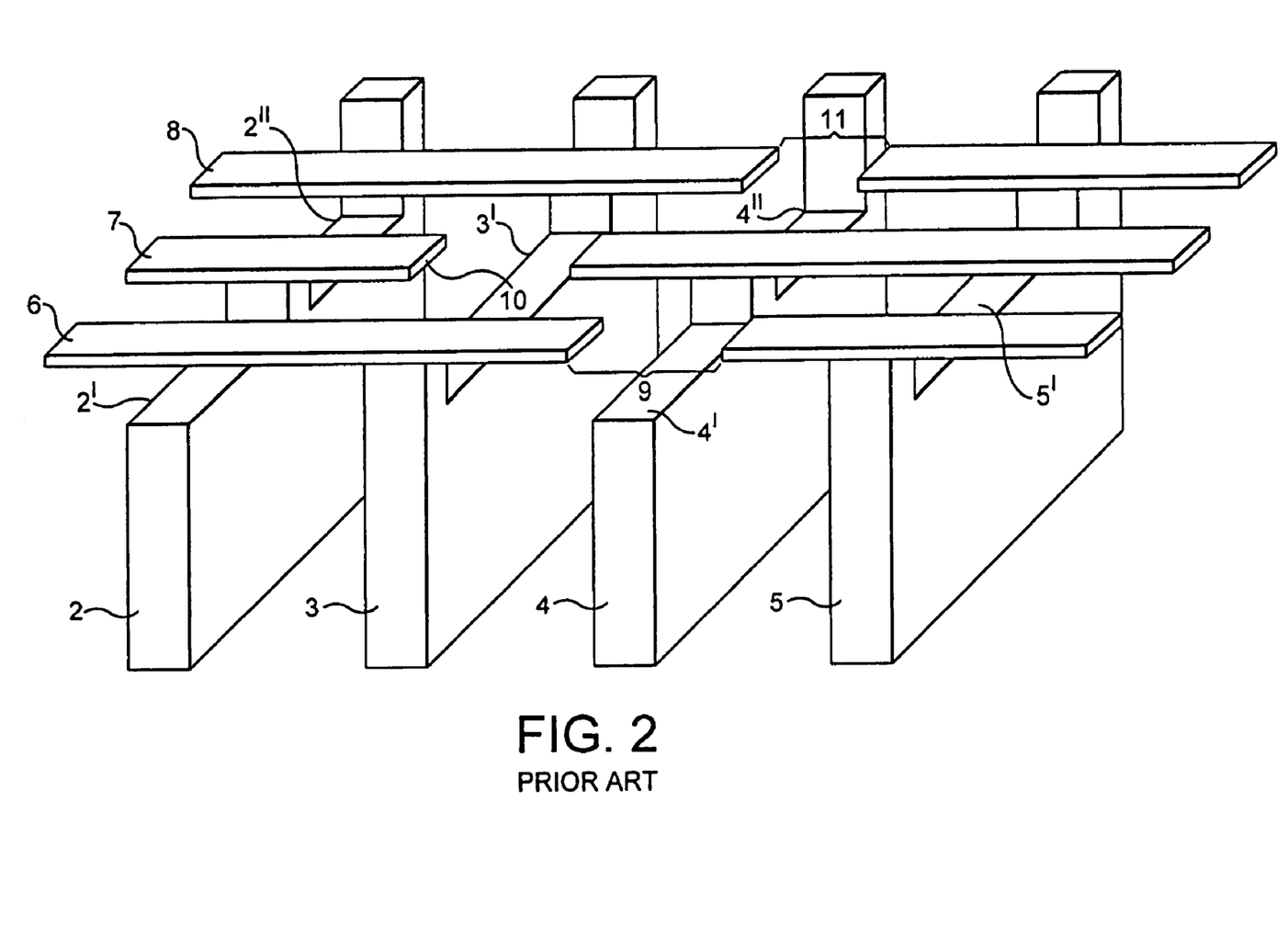
FIG. 2 is a perspective view of vanes of the anode arrangement of FIG. 1.

With reference to FIGS. 1 and 2, a conventional typical anode arrangement is illustrated. The anode arrangement comprises a cylindrical anode wall, indicated generally by the reference numeral 1, and a plurality of anode vanes, four of which 2-5 are illustrated in both FIGS. 1 and 2. The anode vanes extend radially inwardly from the inner wall of the cylindrical anode 1. A plurality of straps 6, 7 and 8 for the vanes are also illustrated. Strap 6 contacts alternate anode vanes, such as vanes 3 and 5, and is spaced from the other vanes, such as vanes 2 and 4. Cut-out regions 2', 2" and 4', 4" in the vanes 2 and 4 respectively help to ensure that the strap 6 does not come into contact with these vanes. Strap 7 contacts those anode vanes that are not contacted by the strap 6 i.e. it contacts vanes 2 and 4. This strap is also spaced from the other alternate vanes, such as vanes 3 and 5. Similar cutouts 3' and 5' in vanes 3 and 5 respectively help to ensure that the strap 7 does not come into contact with them. The third strap 8 is in contact with the same vanes as is the strap 6. The purpose of this extra strap is to balance the $\pi$ mode r.f. field at the cathode. This is described in our UK Patent No. 2054256.

The straps 6, 7, 8 comprise concentric rings, typically made of silver-plated copper. The rings shown in FIGS. 1 and 2 are open rings; ie. They each have a so-called strap break 9 to 11 respectively. Typically, the breaks 9 to 11 are a little longer than the width of a vane, although this need not be the case. In this drawing, the strap breaks 9 to 11 are located over anode vanes, but other arrangements are possible. Although the strap breaks 9 to 11 are necessary to prohibit flow of current between the vanes, they tend to cause greater frequency separation between the $\pi$ mode of operation and the $\pi$-1 mode. Furthermore, the strap breaks may cause oscillations at undesired frequencies.

Figure 3:
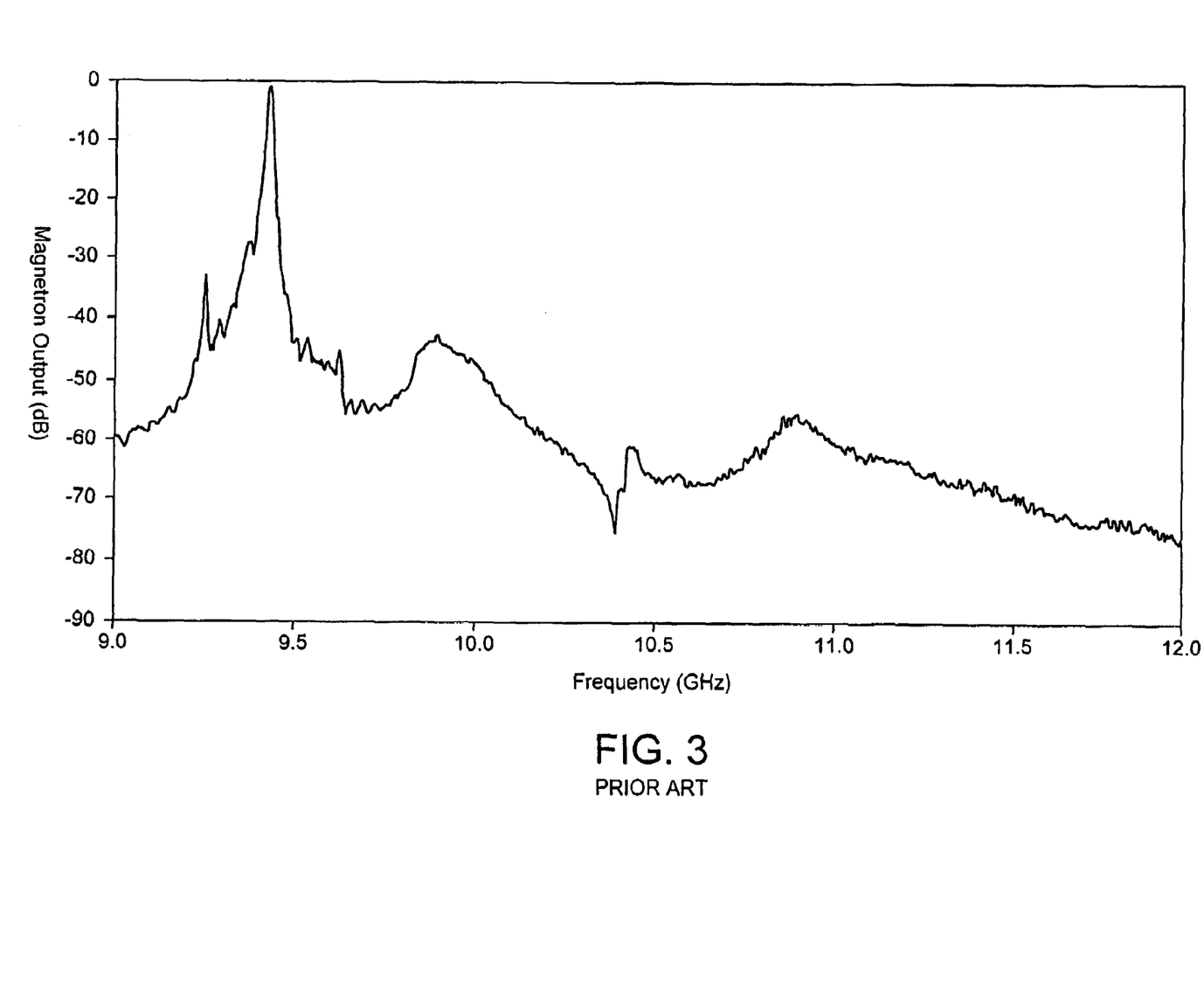
FIG. 3 is a graph illustrating magnetron output power against frequency, for a conventional magnetron.

The graph of FIG. 3 represents the output of a conventional magnetron, such as that shown in FIGS. 1 and 2, across a range of frequencies (the X-band). The main output peak occurs at approximately 9.4 GHz, which represents the $\pi$ mode i.e. the desired mode of operation. However, there is a secondary peak occurring at approximately 9.9 GHz. This represents the undesired $\pi$-1 mode of operation. Power is also emitted at higher frequencies.

Figure 4:
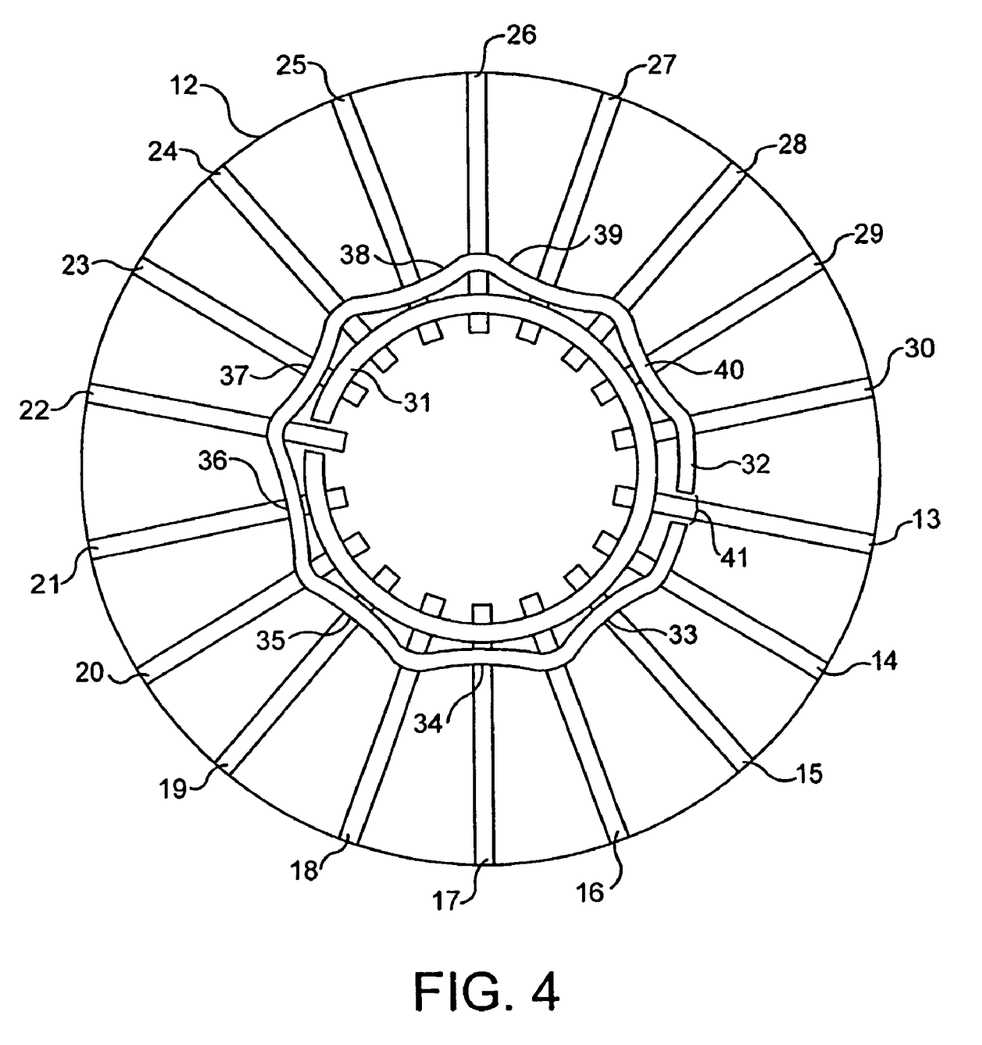
FIG. 4 is a plan view of the anode and strap arrangement of a magnetron constructed according to the invention.

FIG. 4 illustrates components of a magnetron constructed according to the invention. The anode arrangement is shown, which arrangement comprises a cylindrical anode 12 and a plurality of anode vanes 13 to 30 extending radially inwardly from the inner wall of the cylindrical anode. Two straps 31, 32 are also provided. The inner strap 31 comprises a ring attached to alternate ones of the vanes, for example vanes 13, 15, 17, 19, 21, 23, 25, 27 and 29. The outer strap 32, concentric with strap 31, is attached to the other vanes, in this instance vanes 14, 16, 18, 20, 22, 24, 26, 28 and 30.

In accordance with the invention, the outer strap 32 includes a plurality of protrusions 34 to 40. In this embodiment, the protrusions 33 to 40 project inwardly from the ring and are also periodically spaced around the ring. An exception to this is the portion that includes the strap break 41, which portion does not have a protruding region. The protrusions are arranged between the parts of the ring that are attached to the anode vanes. In other words, the protrusions are located adjacent the vanes that are not attached to the outer strap.

The protrusions 33 to 40 introduce a variation in capacitance between the inner strap 31 and the outer strap 32. Owing to the periodic spacing of the protrusions, there is a periodic variation in inter-strap capacitance. The protrusions create a "lumped" variation in capacitance, which has the effect of increasing stability of the pi mode. The invention also reduces the harmonic content of the pi mode, as well as limiting oscillations in the pi–1 mode.

Figure 5:
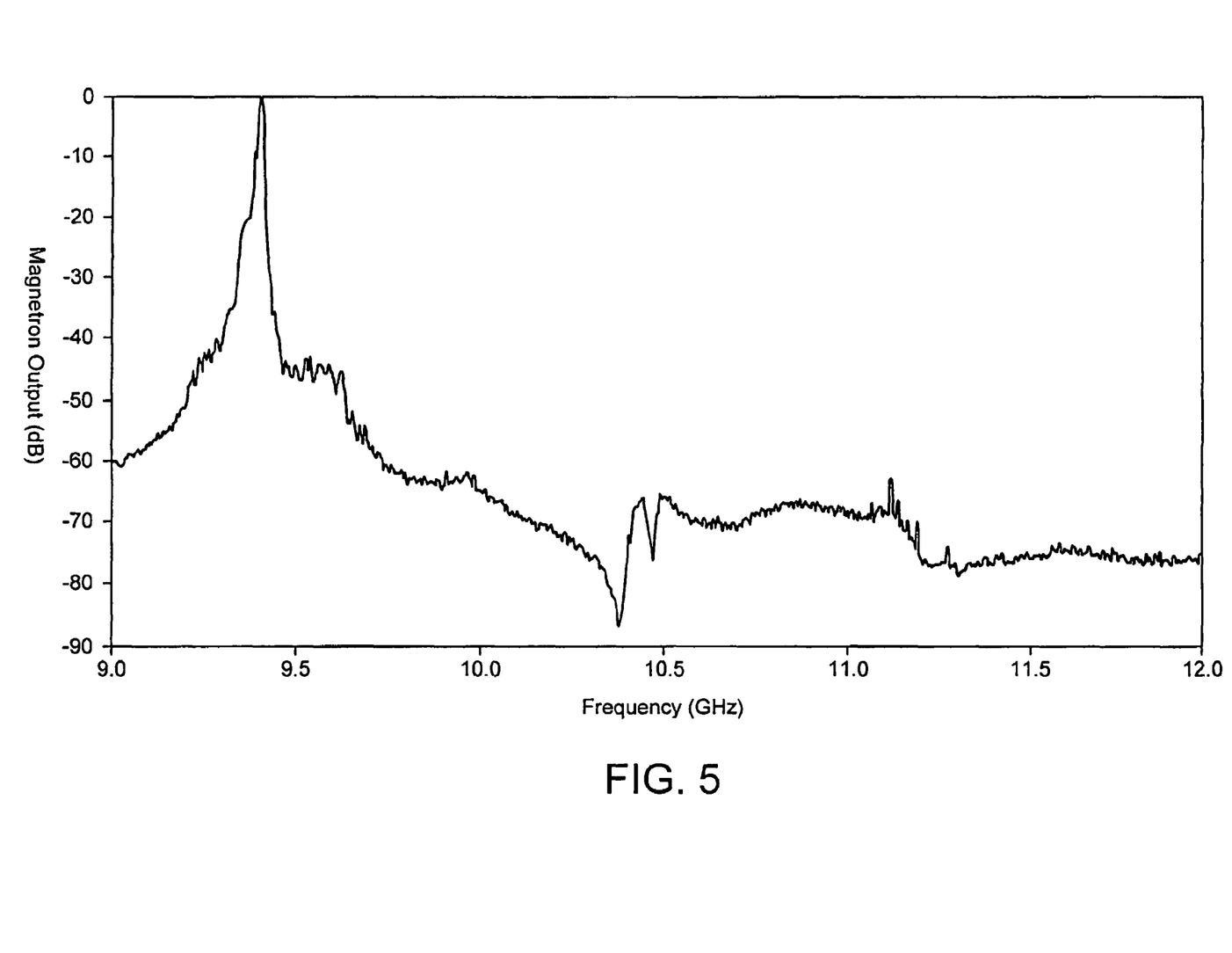
FIG. 5 is a graph illustrating magnetron output power against frequency, for the magnetron of FIG. 4.

The plot of FIG. 5 illustrates the output power achievable with the present invention, across the same range of frequencies as that shown in FIG. 3. The invention gives a cleaner spectrum of the desired pi mode at approximately 9.4 GHz and the secondary peak in FIG. 3 representing the pi–1 mode is no longer present. It is also noticeable that the output at higher frequencies is markedly smaller than that shown in FIG. 3.

Figure 6:
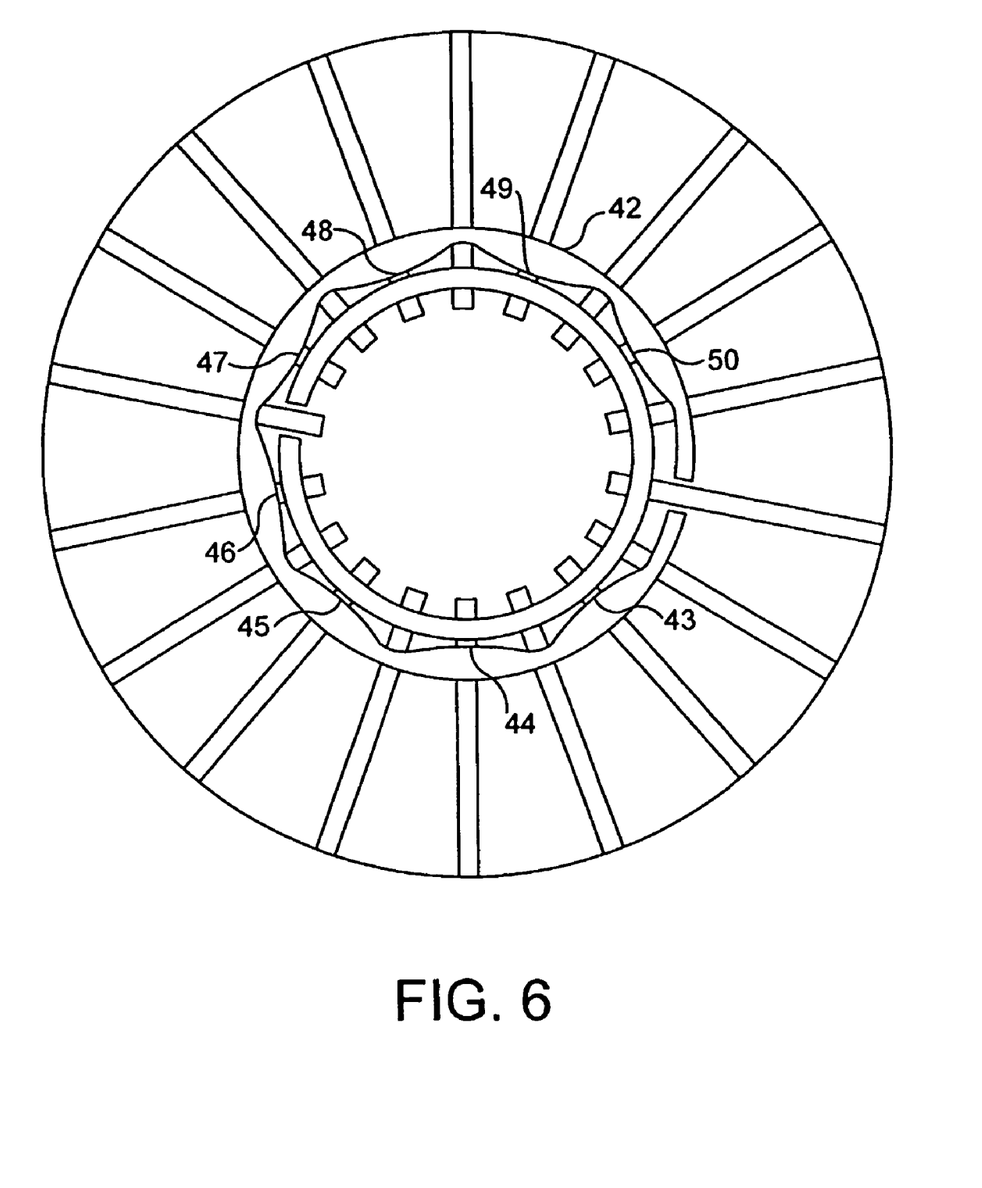
FIG. 6 is a plan view of the anode and strap arrangement of an alternative magnetron constructed according to the invention.

In the embodiment shown in FIG. 4, the protrusions take the form of inwardly indented regions of a ring-type strap. The diameter of the strap itself remains substantially constant around the ring, and so the outer edge of the strap protrudes inwardly to correspond with the inward indentations of the strap. Alternatively, as shown in FIG. 6, the outer diameter of the ring can remain substantially constant, so that the outer edge of the strap 42 describes a circle. In this embodiment, the inward protrusions 43 to 50 cause a thickening of the diameter of the strap at the protruding regions. The provision of protruding regions causes a variation in separation between the inner and outer straps, thereby causing a variation in capacitance that has a stabilising effect on the magnetron.

The embodiments shown in FIGS. 4 and 6 show protrusions in the plane of the strap. In addition, or alternatively, protrusions may be arranged out of the plane of the strap. Examples are shown in FIGS. 7 and 8, which both illustrate a group of vanes 51 to 55 and an inner strap 56, but having different outer straps.

Figure 6A:
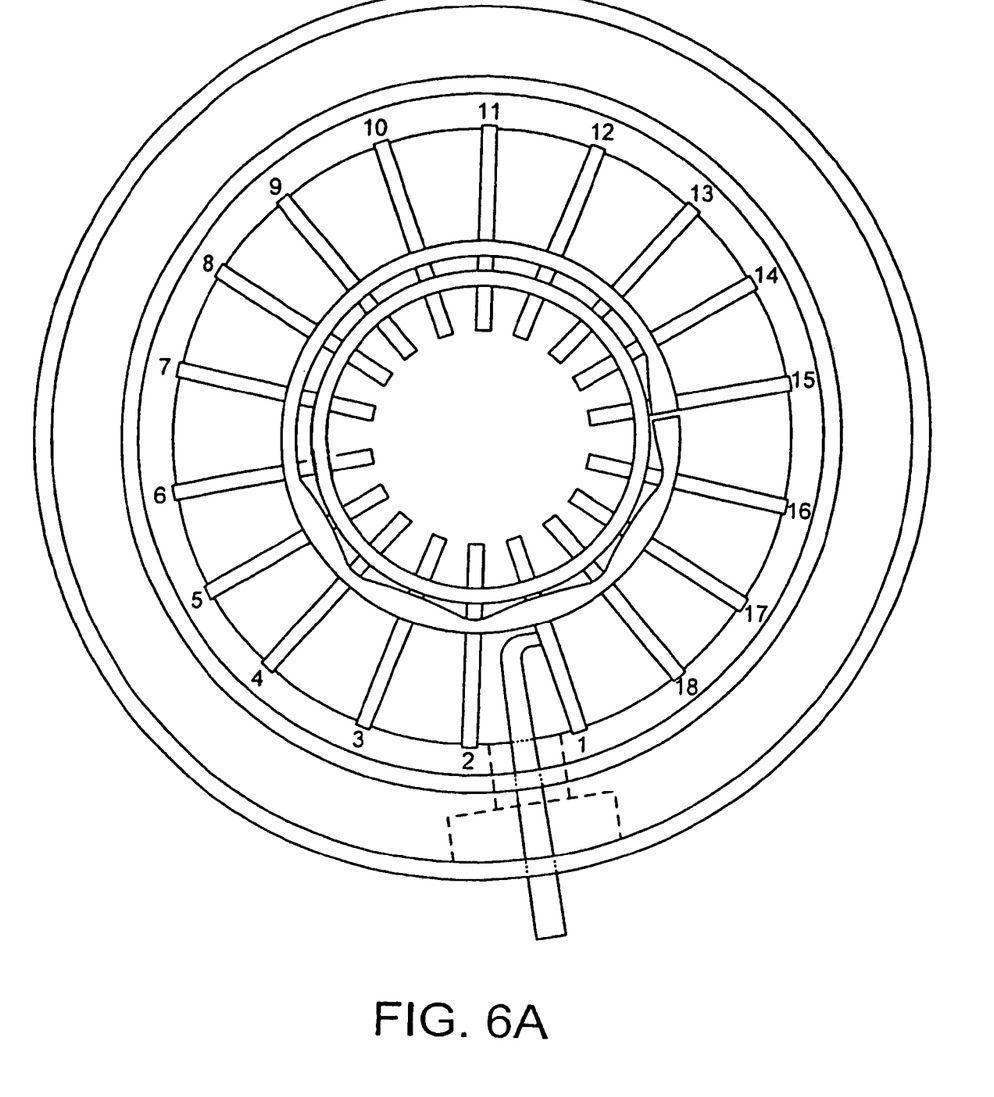
FIG. 6A is a plan view of the anode and strap arrangement of a further alternative magnetron constructed according to the invention.

A further embodiment is shown in FIG. 6A in which protrusions are provided asymmetrically in the sense that the distribution of the protrusions is not even around the strap ring. In this case, the protrusions are arranged only on one half of the strap ring. In this arrangement, cavities numbered 6 to 16 couple the $\pi$ mode, cavities 7 to 15 control coupling the $\pi$–1 mode.

Figure 7:
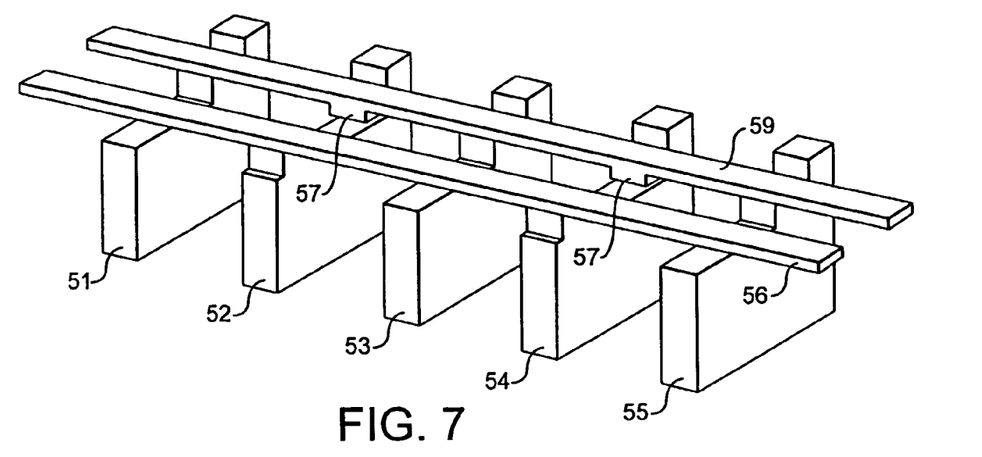
FIG. 7 is a perspective view of anode vanes and a strap arrangement of a magnetron constructed according to an alternative embodiment of the invention.

In FIG. 7, the protrusions take the form of tabs 57, 58 attached to the inner edge of the outer strap 59. The tabs 57 and 58 are arranged to hang downwards, in a plane transverse to the plane of the strap 59. The tabs 57 and 58 are located close to the vanes 52 and 54, to which the strap is not attached. The tabs 57, 58 need not be located intermediate the attachment points; the tabs may also be located at the vanes to which the strap 59 is attached or at any other desired position.

Figure 8:
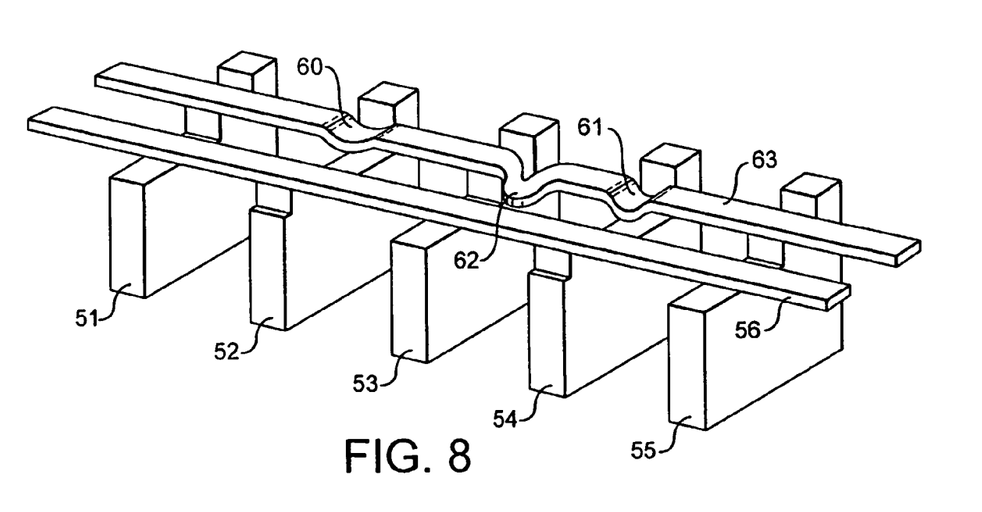
FIG. 8 is a perspective view of anode vanes and a strap arrangement of a magnetron constructed according to a further alternative embodiment of the invention.

FIG. 8 illustrates an embodiment in which the protrusions extend in more than one plane. In this drawing, the protrusions take the form of indented regions 60, 61 and 62. Protrusions 60 and 61 occupy portions of the strap 63 intermediate the attachment points at vanes 51, 53 and 55. The strap 63 is arranged so that the protrusions 60 and 61 extend downwardly towards cutout portions of the vanes 52 and 54. Protrusion 62, which is located close to the vane 53 to which the strap 63 is attached, is arranged to extend inwardly, i.e. towards the cathode.

In any of the examples shown, the capacitance change has the same sense as the direction of protrusion. Specifically, the capacitance is increased at the protruding portions, which protrude so as to be nearer either another strap or anode vane.

In these drawings, the straps have been shown with protrusions extending inwardly or downwardly from the main body of the strap. The protrusions may be arranged to extend outwardly or upwardly from the strap. The protrusions need not be only in the plane of, or perpendicular to, the strap. The protrusions may extend obliquely from the strap.

Alternatively, or additionally, the inner strap could have protrusions, and these need not extend in the same direction, or even in the same plane, as the protrusions on the outer strap. A plurality of straps may be employed, some or all of which may have protruding regions.

The straps need not be rigid; flexible straps may be employed, so that the extent of one or all of the protrusions may be adjusted. This arrangement allows for adjustment of the inter-strap or strap-to-vane capacitance. The provision of a variable capacitance permits the undesired pi−1 mode to be retuned to a different frequency range.

The invention claimed is:

1. A magnetron of the type having a cathode and a surrounding anode, and a plurality of cavities defined by anode vanes comprising at least a first ring strap arranged generally around the cathode and in electrical contact with alternate ones of the vanes, the first ring strap having one or more protruding regions which protrude in a radial direction between the cathode and anode at one or more positions, each protruding region increasing capacitance so as to increase overall capacitance between the first ring strap and a second strap or between the first strap and anode vanes to which the first strap is not connected, the one or more protruding regions causing continuous localized variations in capacitance around the first strap.

2. A magnetron according to claim 1, wherein the one or more positions are between the anode vanes to which the at least first ring strap is connected.

3. A magnetron according to claim 1, wherein the protruding regions protrude radially inwards.

4. A magnetron according to claim 1, wherein the protruding regions protrude towards tips of the anode vanes.

5. A magnetron according to claim 1, wherein the second strap generally is surrounded by the first ring strap, wherein the one or more protruding regions of the first ring strap protrude towards the second strap so as to increase the capacitance between the first and the second straps.

6. A magnetron according to claim 1, wherein the one or more protruding regions are arranged to increase the capacitance for alternate vanes.

7. A magnetron according to claim 1, wherein the one or more protruding regions are arranged asymmetrically around a portion of the at least first strap ring.

8. A magnetron according to claim 7, wherein the one or more protruding regions are arranged on one half of the at least first strap ring.

9. A magnetron according to claim 1, wherein the one or more protruding regions comprise deviations in the first strap ring itself.

10. A magnetron according to claim 1, wherein the one or more protruding regions comprise thickenings of the first strap ring.

11. A magnetron as claimed in claim 1, wherein the first strap has a plurality of protruding regions.

12. A magnetron as claimed in claim 1, wherein the one or more protruding regions are substantially periodically spaced around at least a portion of the first strap.

13. A magnetron as claimed in claim 1, wherein the first strap comprises an open ring.

14. A magnetron as claimed in claim 1, wherein the second strap comprises a closed ring.

15. A magnetron as claimed in claim 1, wherein the first strap is adjustable.

16. A magnetron as claimed in claim 15, wherein the first strap is flexible.

17. A magnetron as claimed in claim 1, wherein the second strap is in contact alternatively with others of the vanes.

18. A magnetron as claimed in claim 17, wherein the second strap includes at least one protruding region.

19. A magnetron as claimed in claim 1, including a plurality of straps, at least some of which have at least one protruding region.

20. A magnetron of the type having a cathode and a surrounding anode, and a plurality of cavities defined by anode vanes comprising at least a first ring strap arranged generally around the cathode and in electrical contact with alternate ones of the vanes, the first ring strap having one or more protruding regions which protrude in a radial direction between the cathode and anode at one or more positions, each protruding region increasing capacitance so as to increase overall capacitance between the first ring strap and a second strap or between the first strap and anode vanes to which the first strap is not connected, the one or more protruding regions causing localized variations in capacitance, wherein the one or more protruding regions are arranged asymmetrically around a portion of the at least first strap ring.

* * * * *